(12) United States Patent
Shukh

(10) Patent No.: US 9,182,460 B2
(45) Date of Patent: Nov. 10, 2015

(54) METHOD OF FABRICATING A MAGNETORESISTIVE ELEMENT

(71) Applicant: Alexander Mikhailovich Shukh, San Jose, CA (US)

(72) Inventor: Alexander Mikhailovich Shukh, San Jose, CA (US)

( * ) Notice: Subject to any disclaimer, the term of this patent is extended or adjusted under 35 U.S.C. 154(b) by 50 days.

(21) Appl. No.: 14/298,966

(22) Filed: Jun. 9, 2014

(65) Prior Publication Data

US 2014/0287537 A1   Sep. 25, 2014

Related U.S. Application Data

(62) Division of application No. 13/445,840, filed on Apr. 12, 2012, now Pat. No. 8,790,798.

(51) Int. Cl.
*H01L 43/08* (2006.01)
*G01R 33/09* (2006.01)
(Continued)

(52) U.S. Cl.
CPC ............ *G01R 33/098* (2013.01); *G11B 5/3909* (2013.01); *H01L 43/08* (2013.01); *H01L 43/10* (2013.01); *H01L 43/12* (2013.01); *G11B 5/3906* (2013.01); *G11C 11/02* (2013.01); *Y10T 428/1114* (2015.01); *Y10T 428/1143* (2015.01)

(58) Field of Classification Search
None
See application file for complete search history.

(56) References Cited

U.S. PATENT DOCUMENTS 4,337,132 A * 6/1982 Jones .................... C23C 14/35
                                                          204/192.32
5,640,343 A    6/1997 Gallagher et al.
6,256,223 B1   7/2001 Sun
(Continued)

OTHER PUBLICATIONS

S.Bandiera et al., IEEE Magetics Letters, v.1, 3000204 (2010).
(Continued)

*Primary Examiner* — Kevin Bernatz

(57) ABSTRACT

A method of fabricating a magnetoresistive element, the method comprising: forming a first plurality of layers without breaking a vacuum, the first plurality of layers sequentially comprising: a first nonmagnetic conductive layer; a first ferromagnetic layer comprising an amorphous structure and a first magnetization direction; a nonmagnetic tunnel barrier layer; a second ferromagnetic layer comprising an amorphous structure and a second magnetization direction, and a getter layer having a direct contact with the second ferromagnetic layer; annealing the first plurality of layers; removing the getter layer and a portion of the second ferromagnetic layer adjacent to the getter layer; forming above the second ferromagnetic layer a second plurality of layers such that interface between the second ferromagnetic layer and the second plurality of layers is formed without breaking a vacuum after removing the getter layer and the portion of the second ferromagnetic layer, the second plurality of layers sequentially comprising: a third magnetic layer comprising a third fixed magnetization direction directed substantially perpendicular to a substrate surface, and a second nonmagnetic conductive layer; wherein the first ferromagnetic layer, the tunnel barrier layer, and the second ferromagnetic layer crystallize during annealing into a coherent body-centered cubic (bcc) structure with (001) plane oriented, the first magnetization direction and the second magnetization direction are directed substantially perpendicular to the substrate surface, the second magnetization direction is fixed and is directed antiparallel to the third magnetization direction, and the first magnetization direction is reversible.

9 Claims, 8 Drawing Sheets

(51) Int. Cl.
*G11B 5/39* (2006.01)
*H01L 43/10* (2006.01)
*H01L 43/12* (2006.01)
*G11C 11/02* (2006.01)

(56) References Cited

U.S. PATENT DOCUMENTS

| | | | |
|---|---|---|---|
| 6,628,542 B2 | 9/2003 | Hayashi et al. | |
| 6,721,201 B2 | 4/2004 | Ikeda | |
| 6,844,605 B2 | 1/2005 | Nishimura | |
| 7,307,302 B2 | 12/2007 | Saito | |
| 7,313,013 B2 | 12/2007 | Sun et al. | |
| 7,432,574 B2 | 10/2008 | Nakamura et al. | |
| 7,528,457 B2 * | 5/2009 | Horng | H01L 43/10 257/421 |
| 7,595,520 B2 * | 9/2009 | Horng | B82Y 25/00 257/295 |
| 7,598,555 B1 | 10/2009 | Parkin | |
| 7,602,000 B2 | 10/2009 | Sun et al. | |
| 7,663,197 B2 | 2/2010 | Nagase et al. | |
| 7,787,288 B2 | 8/2010 | Kitagawa et al. | |
| 7,894,245 B2 | 2/2011 | Sun et al. | |
| 7,924,607 B2 | 4/2011 | Yoshikawa et al. | |
| 8,176,622 B2 * | 5/2012 | Horng | B82Y 25/00 216/22 |
| 8,456,781 B2 * | 6/2013 | Zhao | G11B 5/3906 148/108 |
| 8,790,798 B2 * | 7/2014 | Shukh | H01L 43/08 360/324.11 |
| 2012/0008381 A1 | 1/2012 | Nagase et al. | |
| 2012/0146167 A1 | 6/2012 | Huai et al. | |

OTHER PUBLICATIONS

C.M.Lee et al., Journal of Applied Physics 107, 09C712 (2010).
K.Yakushiji et al., Applied Physics Express 3, 053003 (2010).
S.Ikeda et al., Nature Materials 9, 721-724 (2010).
G.M.Choi et al., Journal of Applied Physics 108, 073913 (2010).
A.T.Hindmarch et al., Applied Physics Express 4, 013002 (2011).
D.C.Worledge et al., Applied Physics Letters 98, 022501 (2011).
K.Mizunuma et al., Applied Physics Express 4, 023002 (2011).
K.Mizunuma et al., Journal of Applied Physics 109, 07C711 (2011).
M.Yamanouchi et al., Jornal of Applied Physics 109, 07C712 (2011).
US, 7,529,121, May 2009, Kitagawa et al. (withdrawn).

* cited by examiner

METHOD OF FABRICATING A MAGNETORESISTIVE ELEMENT

CROSS-REFERENCE TO RELATED APPLICATIONS

This application is a division of U.S. patent application Ser. No. 13/445,840, filed on Apr. 12, 2012, which is herein incorporated by reference in its entirety.

FEDERALLY SPONSORED RESEARCH

Not Applicable

SEQUENCE LISTING OR PROGRAM

Not Applicable

RELEVANT PRIOR ART

U.S. Pat. No. 7,313,013, Dec. 25, 2007—Sun et al.
U.S. Pat. No. 7,663,197, Feb. 16, 2010—Nagase et al.
U.S. Pat. No. 7,924,607, Apr. 12, 2011—Yoshikawa et al.

BACKGROUND

Magnetic (or magnetoresistive) random access memory (MRAM) is a non-volatile solid-state memory employing magnetoresistive (MR) elements or magnetic tunnel junctions (MTJs) to store and retrieve data. The MR element uses a tunnel (or giant) magnetoresistive effect in magnetic multilayers. The MR element includes at least two magnetic layers separated from each other by a thin nonmagnetic insulator or semiconductor layer that serves as a tunnel barrier layer. One of the magnetic layers having a fixed magnetization direction is called a pinned (or reference) layer. Another magnetic layer having a reversible magnetization direction is called a free (or storage) layer. Resistance of the MR element depends on a mutual direction of the magnetizations in the free and pinned layers. The resistance is low when the magnetization directions are parallel to each other and high when they are anti-parallel. Parallel configuration of the magnetization directions corresponds to a logic "0". The anti-parallel configuration of the magnetizations corresponds to logic "1". A difference in the resistance between two logic states can exceed several hundred percents at room temperature. Theory predicts that MR ratio in MTJs made of FeCo/MgO/FeCo multilayer having body-centered cubic (bcc) structure with preferred (001) orientation can exceed 1000% at room temperature. The high TMR is a result of coherent tunneling of highly spin-polarized conductance electrons through the multilayer structure.

The magnetization direction in the free layer can be reversed by an external magnetic field or by a spin-polarized current running through the MR element in a direction perpendicular to its surface (substrate). Reversal of the magnetization direction in the MR element by a spin-polarized current (spin momentum transfer or spin torque transfer) are widely used in MRAM technology. The magnetization direction in the free layer can be controlled by a direction of the spin-polarized current running through the MR element, for instance, from the pinned layer to the free layer or vice-versa.

CoFeB/MgO/CoFeB multilayer has became a system of choice for manufacturing of MTJs. The multilayer having amorphous structure in as-deposited state can be crystallized into coherent body-centered cubic (bcc) structure with a (001) plane oriented. Moreover MgO can form flat and sharp interface with CoFeB layer. That is essential for coherent tunneling of spin-polarized electrons providing high tunneling magnetoresistance (TMR) and low density of switching current.

CoFeB layers typically have a substantial boron content (about 15-30 atomic %) to be amorphous in as-deposited state. MgO layer in the CoFeB/MgO/CoFeB system crystallizes first during annealing at a temperature about 250° C. or above into stable bcc structure with preferred (001) orientation. Then the crystalline MgO layer acts as a template during crystallization of the CoFeB layers because of a good lattice match between the bcc MgO and bcc CoFeB. Annealing can also promote an interfaces sharpness in the CoFeB/MgO/CoFeB multilayer.

Crystallization of CoFeB is a thermally activated process. Therefore annealing at lower (higher) temperatures for longer (shorter) periods may provide similar results. The crystallization of CoFeB requires a reduction in the boron (B) content in the layers. The boron diffuses through the multilayer structure forming other borides with another layers of MTJ stack.

The diffusion of the boron into the MgO tunnel barrier layer may lead to both degradation of TMR and increase of the spin-polarized switching current. In order to reduce accumulation of the boron in the MgO layer during annealing, boron "getter" layer (or layers) may be inserted into the MTJ structure. The reduction of the boron content reduces the crystallization temperature of the CoFeB layers and promotes their transformation from as-deposited amorphous into bcc (001) crystalline structure starting from MgO interfaces.

There are two types of magnetic materials used in the MRAM: materials with in-plane or perpendicular magnetization orientation (or anisotropy). MR elements with a perpendicular orientation of the magnetization (or perpendicular material) have excellent thermal stability and scalability. Moreover theory predicts that perpendicular MR element can have substantially lower density of the switching spin-polarized current than similar MR element using in-plane magnetic materials.

Perpendicular MR elements of MRAM require TMR about 100% or higher and a density of spin-polarized switching current about $1 \cdot 10^6$ A/cm$^2$ or lower. These parameters can be achieved in MR element wherein the tunnel barrier layer and adjacent magnetic free and pinned layers form a coherent bcc (001) texture with sharp and flat interfaces. This texture can be formed by annealing substantially amorphous in as-deposited state CoFeB/MgO/CoFeB multilayer at a temperature about 250° C. and/or above.

The pinned layer of the perpendicular MR element can have a multilayer structure for cancelling its fringing magnetic field produced in the vicinity of the free layer. The fringing filed can affect the thermal stability and switching current of the MR element. The pinned layer having a multilayer structure may comprise a layer of a ferrimagnetic material made of a rare earth-transition metal (RE-TM) alloy such as TbFeCo. Besides the pinned layer can comprise a synthetic antiferromagnetic (SAF) structure.

The pinned magnetic layers with the canceled fringing magnetic field can suffer from a poor thermal stability. For example, the RE-TM alloys may lose their perpendicular anisotropy at the annealing temperature above 200° C. The SAF structures frequently employ an ultrathin nonmagnetic spacer layer having a thickness less than 1 nm. The spacer layer is usually positioned between two magnetic layers forming the SAF structure to produce a substantial antiferromagntic exchange coupling between the magnetic layers. That is essential for stable perpendicular magnetization direction of the pinned layer made of CoFeB. Annealing of the SAF structure at the temperature about 250° C. and above may cause un uncontrollable diffusion through the ultrathin spacer layer and reduce the exchange coupling between the magnetic layers. That may lead to substantial reduction of TMR and increase of spin-polarized switching current.

Industry-wide efforts are underway to increase the TMR and to reduce the density of the spin-polarized switching current in the perpendicular MR elements for effective integration with CMOS technology. The present disclosure addresses to the above problems.

SUMMARY

Disclosed herein is a magnetoresistive element that comprises a free ferromagnetic layer comprising a first reversible magnetization direction directed substantially perpendicular to a film surface, a pinned ferromagnetic layer comprising a second fixed magnetization direction directed substantially perpendicular to the film surface, and a nonmagnetic insulating tunnel barrier layer disposed between the free ferromagnetic layer and the pinned ferromagnetic layer, wherein the free ferromagnetic layer, the tunnel barrier layer, and the pinned ferromagnetic layer have a coherent body-centered cubic (bcc) structure with a (001) plane oriented, and a bidirectional spin-polarized current passing through the coherent structure in a direction perpendicular to the film surface reverses the magnetization direction of the free ferromagnetic layer.

Also disclosed is a magnetoresistive element that comprises a free ferromagnetic layer comprising a first reversible magnetization direction directed substantially perpendicular to a film surface, a pinned ferromagnetic layer comprising a second fixed magnetization direction directed substantially perpendicular to the film surface, a nonmagnetic insulating tunnel barrier layer disposed between the free ferromagnetic layer and the pinned ferromagnetic layer, a first nonmagnetic conductive layer disposed contiguously to a side of the free ferromagnetic layer opposite to the tunnel barrier layer, and a pinning magnetic layer disposed adjacent to a side of the pinned ferromagnetic layer opposite to the tunnel barrier layer, and comprising a third fixed magnetization direction directed substantially perpendicular to the film surface, the pinning magnetic layer has a substantial antiferromagnetic exchange coupling with the pinned ferromagnetic layer, wherein the free ferromagnetic layer, the tunnel barrier layer, and the pinned ferromagnetic layer have a coherent body-centered cubic (bcc) structure with a (001) plane oriented, and a bidirectional spin-polarized current passing through the coherent structure in a direction perpendicular to the film surface reverses the magnetization direction of the free ferromagnetic layer.

Also disclosed is a method of fabricating a magnetoresistive element, the method comprising: forming on a substrate a first plurality of layers such that interfaces of the first plurality of layers are formed without breaking a vacuum, the first plurality of layers comprising: first nonmagnetic conductive layer formed above the substrate; a first ferromagnetic layer formed above the first nonmagnetic conductive layer and comprising an amorphous structure and a first magnetization direction; a nonmagnetic tunnel barrier layer formed above the first ferromagnetic layer; a second ferromagnetic layer formed above the nonmagnetic tunnel barrier layer and comprising an amorphous structure and a second magnetization direction, and a getter layer formed above an having a direct contact with the second ferromagnetic layer; annealing the first plurality of layers; removing the getter layer and a portion of the second ferromagnetic layer adjacent to the getter layer; forming above the second ferromagnetic layer a second plurality of layers such that interface between the second ferromagnetic layer and the second plurality of layers is formed without breaking a vacuum after removing the getter layer and the portion of the second ferromagnetic layer, the second plurality of layers comprising: a third magnetic layer formed above the second ferromagnetic layer and comprising a third fixed magnetization direction directed substantially perpendicular to a substrate surface, and a second nonmagnetic conductive layer formed above the third magnetic layer; wherein the first ferromagnetic layer, the tunnel barrier layer, and the second ferromagnetic layer crystallize during annealing into a coherent body-centered cubic (bcc) structure with (001) plane oriented, the first magnetization direction and the second magnetization direction are directed substantially perpendicular to the substrate surface, the second magnetization direction is fixed and is directed antiparallel to the third magnetization direction, and the first magnetization direction is reversible and is controlled by a direction of a spin-polarized current running through the magnetoresistive element in a direction perpendicular to the substrate surface.

These and various other features and advantages will be apparent from a reading of the following detailed description.

Figure 1A:
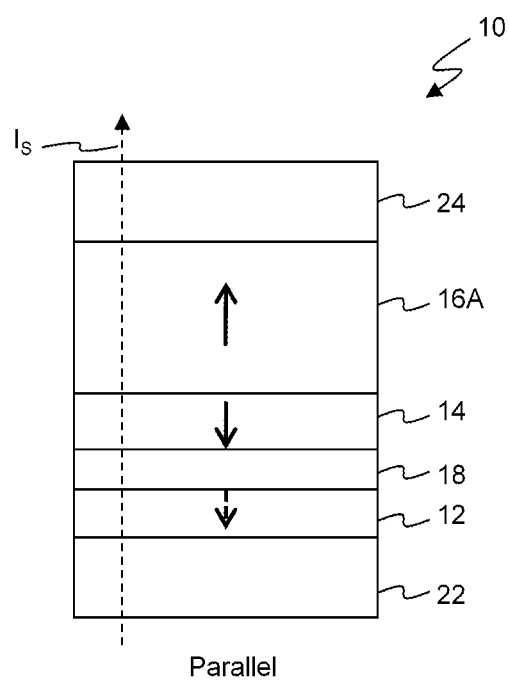
FIGS. 1A and 1B are schematic sectional views showing a magnetoresistive element with spin-induced switching having different logic states according to an embodiment of the present disclosure.

EXPLANATION OF REFERENCE NUMERALS 10, 20, 30, 40 magnetoresistive element
12 free (or storage) ferromagnetic layer
14 pinned (or reference) ferromagnetic layer
16A, 16B pinning layer
18 tunnel barrier layer
22 seed layer (or underlayer)
24 cap layer (or overlayer)
26 interface layer
32 spacer layer
52 getter layer
60 method of fabricating the magnetoresistive element 10
61, 62, 63, 64, steps of the fabricating method 60

DETAILED DESCRIPTION

Embodiments of the present disclosure will be explained below with reference to the accompanying drawings. Note that in the following explanation the same reference numerals denote constituent elements having almost the same functions and arrangements, and a repetitive explanation will be made only when necessary. Since, however, each figure is an exemplary view, it should be noted that the relationship between the thickness and planar dimensions, the ratio of the thicknesses of layers, and the like are different from the actual ones. Accordingly, practical thicknesses and dimensions should be judged in consideration of the following explanation.

Note also that each embodiment to be presented below merely discloses an device or method for embodying the technical idea of the present disclosure. Therefore, the technical idea of the present disclosure does not limit the materials, shapes, structures, arrangements, and the like of constituent parts to those described below. The technical idea of the present disclosure can be variously changed within the scope of the appended claims.

Refining now to the drawings, FIGS. 1-4 illustrate exemplary aspects of the present disclosure. Specifically, these figures illustrate MR element having a multilayer structure with a perpendicular direction of magnetization in magnetic layers. The direction of the magnetization in the magnetic layers are shown by solid or dashed arrows. The MR element can store binary data by using steady logic states determined by a mutual orientation of the magnetizations in the magnetic layers separated by a tunnel barrier layer. The logic state "0" or "1" of the MR element can be changed by a spin-polarized current running through the element in the direction perpendicular to layers surface (or substrate). The MR element may be included as a part of magnetic random access memory (MRAM).

The MR element herein mentioned in this specification and in the scope of claims is a general term of a tunneling magnetoresistance (TMR) element using a nonmagnetic insulator or semiconductor as a tunnel barrier layer. Although the following figures each illustrate the major components of the MR element, another layer may also be included as long as the arrangement shown in the figure is included.

Figure 1B:
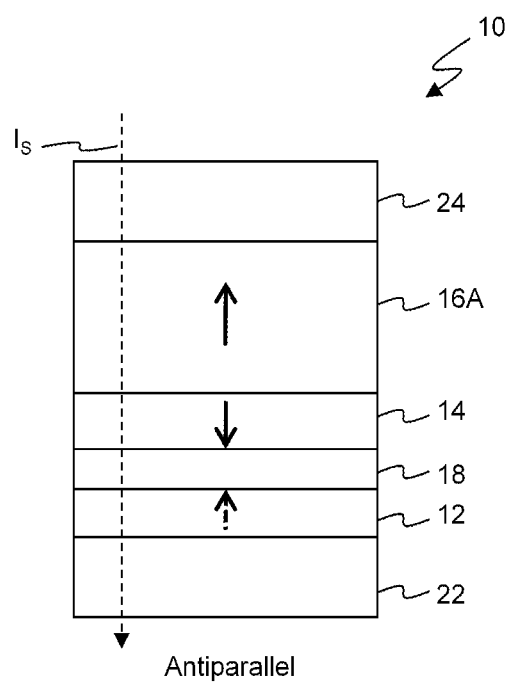

In particular, as illustrated in FIGS. 1A and 1B, an exemplary aspect of the present disclosure includes a MR element 10, which comprises at least a free magnetic layer 12, a pinned magnetic layer 14, a pinning layer 16A, a tunnel barrier layer 18 disposed in-between the free 12 and pinned 14 layers. The magnetic layers 12 and 14, and the pinning layer 16A have magnetization directions directed substantially perpendicular to the layers surface (or substrate, not shown) in their equilibrium state. Direction of the magnetizations in the layers 12, 14 and 16A in the equilibrium state is indicated by arrows. The magnetization direction of the free layer 12 (shown by dashed arrow) can be reversed by a spin-polarized current $I_s$ running through the element 10 in a direction perpendicular to the layers surface (substrate). The magnetization direction of the pinned layer 14 (solid arrow) is fixed. The pinned magnetic layer 14 may also have a coercive force substantially larger than that of the free layer 12.

The magnetization direction of the pinned layer 14 is fixed by a substantial exchange coupling with the pinning layer 16A. The pinned layer 14 has a direct contact with the pinning layer 16A.

The direction of the magnetizations in the layers 14 and 16A are antiparallel to each other. The antiparallel orientation of the magnetizations cancels a fringing (or leakage) magnetic field produced by the layer 14 in the vicinity of the free layer 12. For example the magnetization direction of the pinned layer 14 is directed downward (shown by a solid "down" arrow). Respectively, the magnetization direction of the pinning layer 16A is directed "upward" (shown by the solid "upward" arrow). The direction of the magnetizations in the layers 14 and 16A may have opposite configuration with the upward direction in the pinned layer 14 and downward direction in the pinning layer 16A. The MR element 10 further includes a seed layer 22 and a cap layer 24. Wafer and conductive electrodes are not shown.

The pinned layer 14 may produce a substantial fringing (leakage) magnetic field affecting the free layer 12. The fringing magnetic field interferes with switching characteristics and thermal stability of the MR element 10. Accordingly, a reduction of the fringing field produced by the pinned layer 14 is essential for performance of the MR element 10.

One of the methods for reducing the leakage magnetic field from the pinned layer 14 having a perpendicular magnetization (anisotropy) is using a ferrimagnetic material. The pinning layer 16A of the MR element 10 comprises the ferrimagnetic rear-earth-transition metal (RE-MT) alloy such as TbCoFe. Typical examples of RE are Tb, Gd, Dy, Ho, and Er that stabilize the perpendicular magnetization in RE—CoFe alloys. The Re—FeCo alloys can have an amorphous structure. When the RE composition of the RE—FeCo alloy is close to a compensation point, the saturation magnetization $M_s$ becomes almost zero. At the compensation point the cause of the saturation magnetization $M_s$ changes from FeCo to the RE element and vice-versa, and the coercive force $H_c$ has a maximum. The pining layer 16A made of the RE-rich alloy can produce a substantial antiferromagnetic exchange coupling with the pinned magnetic layer 14. Accordingly, the total (net-$M_s$) saturation magnetization of the structure composed by the pinned layer 14 and pinning layer 16A can be set almost zero by controlling the content of the RE-rich alloy or by controlling a thickness of the pinning layer 16A.

A cancelation of the fringing magnetic field produced by the pinned layer in the vicinity of the free layer 12 is essential for improving the thermal stability and reduction of the switching current of the MR element 10. The fringing magnetic field causes an unwanted bias of the free layer 12. This results in different magnitudes of the spin polarized current required for switching of the MR element 10 from a logic state "0" to logic state "1" or vice-versa. Besides, the biased MR element 10 can have a reduced stability along the direction of the fringing filed.

In the given exemplarily embodiment the free layer 12 and the pinned layer 14 can be produced by a sputter deposition in a vacuum chamber from a target made of $(Co_{25}Fe_{75})_{85}B_{15}$ (at. %) alloy. The thickness of the layers 12 and 14 can be about 1.8 nm and 2.5 nm, respectively. The tunnel barrier layer 18 can be made of MgO and have a thickness of about 1.1 nm. The tunnel barrier layer 18 can be made by a RF-sputter deposition in vacuum chamber from MgO target.

The free layer 12 can be deposited on the seed layer 22 made of the tantalum (Ta). Thickness of the seed layer 22 can be of about 5 nm. The CoFeB-based free layer 12 can be disposed between the seed 22 and tunnel barrier 18 layers. The layer 12 can exhibit a substantial perpendicular magnetic anisotropy due to a surface magnetic anisotropy at the Ta/CoFeB and CoFeB/MgO interfaces. Besides the Ta-based seed layer 22 can serve as a getter for the boron dissolved in the free layer 12. During annealing the boron can diffuse from the free layer 12 into the seed layer 22. Reduction of the boron concentration in the free layer 12 can promote its crystallization into bcc (001) texture at reduce annealing temperature. The alternative materials for formation of the seed layer 22 will be described later.

Similarly, the crystallization of the CoFeB pinned layer 14 usually starts from its interface with the MgO layer 18. The MgO layer 18 having stable bcc (001) texture serves as a template and promotes formation of the coherent crystalline bcc (001) texture in the pinned layer 14. Diffusion of the boron from the layer 14 from the MgO/CoFeB interface into a getter layer (not shown in the FIGS. 1A and 1B) can facilitate the crystallization. The alternative materials for formation of the free 12, pinned 14 and tunnel barrier 18 layers will be described later. Perpendicular magnetization (or anisotropy) in the pinned layer 14 can be provided by a surface magnetic anisotropy at the MgO/CoFeB interface along with a substantial exchange coupling between the pinned 14 and pinning 16A layers. In the given exemplarily embodiment the pinning layer 16A can be made of RE-rich alloy with uncompensated magnetic moment such as $(Fe_{90}Co_{10})_{72}Tb_{28}$ and can have a thickness of about 30 nm. The ferrimagnetic RE-rich pinning layer 16A can produce a substantial antiferromagnetic exchange coupling with the ferromagnetic pinned layer 14. The direction of the magnetizations in the antiferromagnetically coupled layers 14 and 16A layers are antiparallel as shown by solid arrows in FIGS. 1A and 1B. Hence the net fringing magnetic field of the pinned 14 and pinning 16A layers in the vicinity of the free layer 12 can be cancelled out. The pinning layer 16A made of the ferrimagnetic RE-TM alloy can have a substantial perpendicular anisotropy. Therefore the crystallized CoFe(B) pinned layer 14 may have stable uniform perpendicular magnetization. The alternative materials for formation of the pinning layer 16A will be described later.

Furthermore, a cap layer 24 may also be formed on the pinning layer 16A. In the given exemplarily embodiment the cap layer 24 can be made of platinum (Pt). The cap layer 24 functions as a protective layer that prevents an oxidation of the RE-TM-based pinning layer 16A. Moreover, the cap layer 24 made of Pt can stabilize the perpendicular anisotropy in the pinning layer 16A. The cap layer 24 can be about 5 nm thick. The alternative materials for formation of the cap layer 24 will be described later.

In the MTJ element 10 the magnetization directions (shown by arrows) of the free 12 and pinned 14 layers may be are arranged in parallel (FIG. 1A) or antiparallel (FIG. 1B) configuration. Resistance of the MR element 10 depends on mutual direction of the magnetizations in the layers 12 and 14. The MR element 10 with parallel direction of the magnetizations has a lowest resistance that corresponds to a logic "0". On the contrary, the MR element with the antiparallel direction of the magnetizations exhibits the highest resistance that corresponds to a logic "1". A spin-polarized current $I_s$ is used to reverse the direction of the magnetization in the free layer 12 and to change the logic state of the MR element 10.

More specifically, when the spin-polarized current $I_s$ flows from the free layer 12 to the pinned layer 14 through the tunnel barrier layer 18, as shown in FIG. 1A (conductance electrons run in the opposite direction), the electrons storing a spin information of the pinned layer 14 are injected into the free layer 12. A spin angular momentum of the injected electrons is transferred to electrons of the free layer 12 in accordance with the law of spin angular momentum conservation. This forces the magnetization direction of the free layer 12 to be oriented in parallel with the magnetization direction of the pinned layer 14 (logic "0").

On the other hand, when the spin-polarized write current $I_s$ flows from the pinned layer 14 to the free layer 12, as shown in FIG. 1B, the spin-polarized electrons run in the opposite direction from the free layer 12 to the pinned layer 14. The electrons having spin oriented in parallel to the magnetization direction of the pinned layer 14 are transmitted. The electrons having spin antiparallel to the magnetization direction of the pinned layer 14 are reflected. As a result, the magnetization orientation of the free layer 12 is forced to be directed antiparallel to the magnetization direction of the pinned layer 14 (logic "1"). Reading of the data stored in the MR element 10 is provided by measuring its resistance and comparing it with the resistance of the reference element (not shown).

Figure 2:
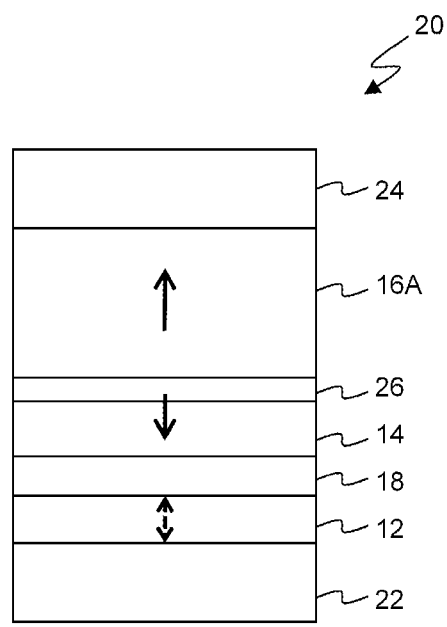
FIG. 2 is a schematic sectional view showing a magnetoresistive element according to another embodiment of the present disclosure.

FIG. 2 illustrates another exemplarily embodiment of the of the present disclosure. MR element having a structure similar to the MR element 10, may further comprise an interface layer 26. The layer 26 is disposed between the pinned 14 and pinning 16A layers. The layer 26 provides a smooth interfaces between the layers 14 and 16A. Besides the layer 26 may reduce the crystalline lattice misfit at the interlace between the substantially crystalline CoFe(B) pinned layer 14 and amorphous TbCoFe pinning layer 16A. The layer 26 can be made of CoFeB alloy and may have a thickness of about 0.5 nm. The interface layer 26 can promote an exchange coupling between the substantially crystalline pinned 14 and amorphous pinning 16A layers. Increase of the exchange coupling between the layers 14 and 16A can improve the perpendicular anisotropy in the pinned layer 14 that can result in the increase of TMR and reduction of the spin-polarized switching current.

Figure 3:
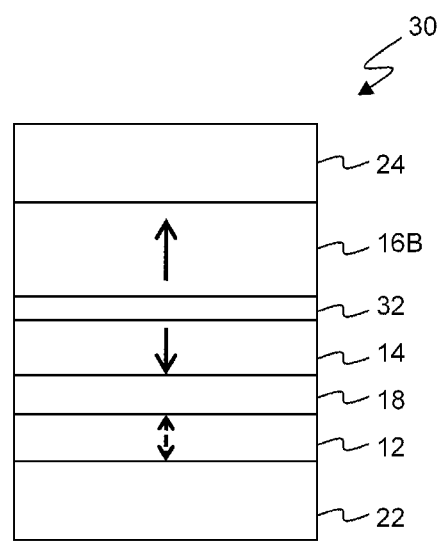
FIG. 3 is a schematic sectional view showing a magnetoresistive element according to an alternative embodiment.

FIG. 3 shows an alternative exemplary embodiment of the present disclosure. MR element 30 distinguishes from the MR element 10 shown in FIGS. 1A and 1B by a structure of the pinning layer. The pinning layer 16A of the MR element 10 made of the RE-rich alloy can be replaced by a bilayer structure comprising a ferromagnetic pinning layer 16B and a nonmagnetic spacer layer 32. The spacer layer 32 is positioned in-between the pinned 14 and pinning 16B layers and provides a substantial antiferromagnetic exchange coupling between the ferromagnetic layers.

The pinning layer 16B can be made of a ferromagnetic material having a substantial perpendicular anisotropy, for example, of a multilayer $[Co(0.2\ nm)/Pt(0.2\ nm)]_{10}$, where 10 is a number of Co/Pt bilayers. The spacer layer 32 can be made of a thin layer of ruthenium (Ru) having a thickness of about 0.85 nm. In the given structure a substantial antiferromagnetic exchange coupling between the layers 14 and 16B can be observed. The direction of the magnetizations (shown by solid arrows) in the pinned 14 and pinning 16B layers is antiparallel. The antiparallel configuration of the magnetization directions cancels the fringing magnetic field produced by the pinned layer 14 in the vicinity of the free layer 12 that is essential for a high thermal stability and low switching current of the MR element 30. Alterative materials for the pinning layer 16B and spacer layer 32 will be described latter.

Figure 4:
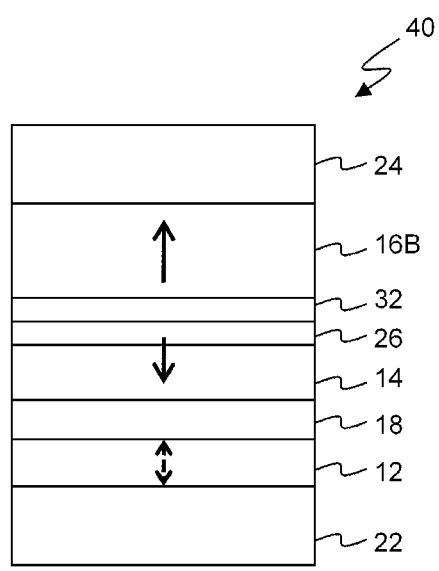
FIG. 4 is a schematic sectional view showing a magnetoresistive element according to another alternative embodiment of the present disclosure.

As shown in FIG. 4, the interface layer 26 may also be inserted in-between the pined 14 and the spacer 32 layers. The layer 26 can be made of a ferromagnetic material having a substantial spin-polarization and providing a smooth interface between the substantially crystalline CoFe(B) pinned layer 14 and the thin spacer layer 32. For instance, the interface layer 26 can be made of amorphous $(Co_{25}Fe_{75})_{85}B_{15}$ alloy having thickness of about 0.5 nm. The sharpness and flatness of the interface between the layers 26 and 32 is required for providing a substantial exchange coupling between the pinned 14 and pinning 16B layers. The pinning layer 16B can be made of a multilayer $(Co(0.2\ nm)/Pt(0.2\ nm))_{12}$. The alternative materials for formation of the interface layer 26 will be disclosed latter.

The layer 26 has a substantial ferromagnetic exchange coupling with the ferromagnetic pinned layer 14. Therefore the layers 14 and 26 can have similar direction of the magnetization and behave like one magnetic volume. The CoFe(B) pinned layer 14 can have a substantially crystalline texture after annealing and may have a rough top surface after etching that facing the spacer layer 32. The roughness can deteriorate a strength of the antiferromagnetic exchange coupling between the layers 14 and 16B through ultrathin spacer layer 32 resulting in the degradation of perpendicular anisotropy of the layer 14. To provide a smooth interface between the layers 14 and 32 the layer 26 can be used. As a result, the magnetization directions of the pinned 14 and pinning 16B layers are oriented antiparallel to each other. This configuration of the magnetizations leads to a cancelation of the fringing field in the vicinity of the free layer 12.

Figure 5A:
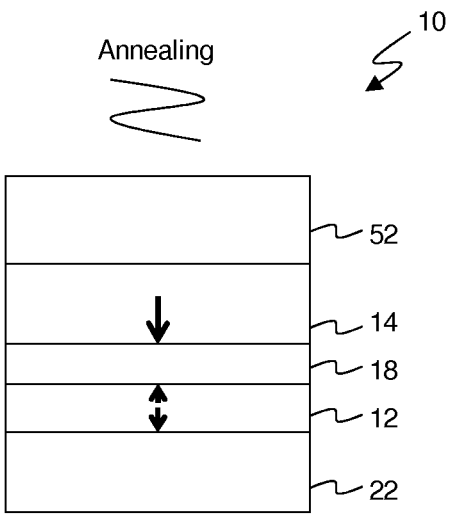
FIGS. 5A-5C illustrate different steps of fabricating method of a magnetoresistive element according to the embodiment of the present disclosure.
Figure 5B:
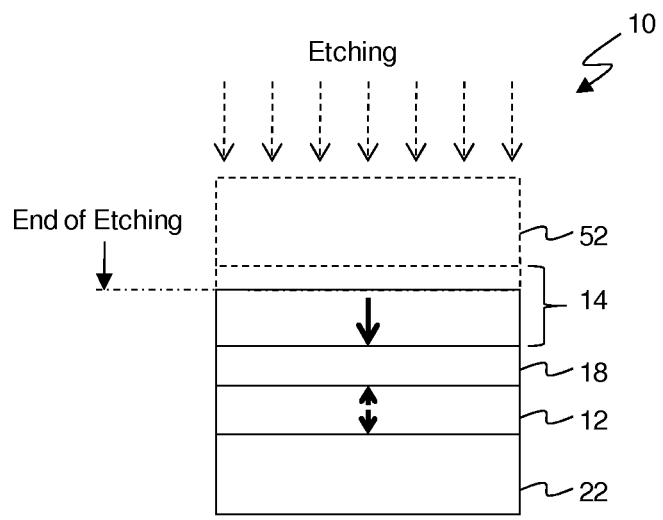
Figure 5C:
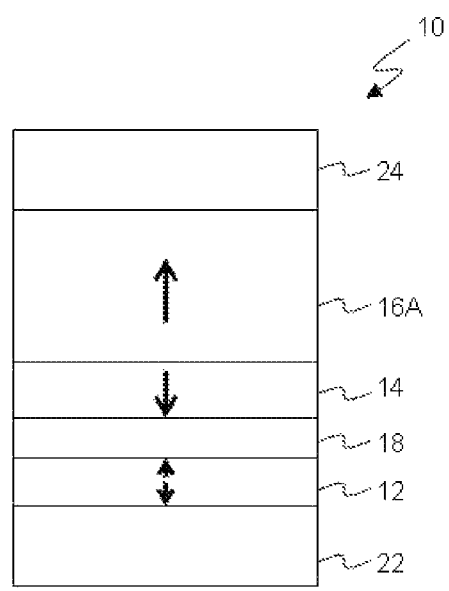

Another aspect of the present disclosure includes a method of fabricating an MR element. FIGS. 5A-5C illustrate exemplary steps of the method of fabricating a spin-current switchable MR element 10 shown in FIGS. 1A and 1B.

As shown in FIG. 5A, a layer 22 made of tantalum (Ta) and having a thickness of about 5 nm is formed on a substrate (not shown) as a seed layer. A free layer 12 made of amorphous CoFeB having a thickness of about 1.5 nm is formed on the seed layer 22. An MgO layer having a thickness of about 1.1 nm is formed on the free layer 12 as a tunnel barrier layer 18. An amorphous CoFeB layer having a thickness of about 2.5 nm is formed on the tunnel barrier layer 18 as a pinned layer 14. To promote a crystallization of the as-deposited amorphous pinned layer 14 into desirable bcc (001) texture during following annealing, a getter layer 52 made of Zr and having a thickness of about 3 nm is formed on the pinned layer 14. All the above deposited layers can be formed by a sputter deposition in a vacuum chamber without breaking the vacuum. Then annealing is performed at a temperature about 350° C. for about 1 hour. A magnetic field about 100 Oe or above may be applied during annealing in parallel or perpendicular direction relatively to a substrate surface.

Crystallization of the CoFeB requires a reduction of the boron content in the layers. Excessive amount of the boron diffuses into adjacent layers of the MTJ. Diffusion of the boron into MgO barrier layer is undesirable since it may cause a destruction of coherent tunneling resulting in TMR reduction and switching current increase. In order to reduce the accumulation of the boron in the MgO barrier during annealing, boron "getter" layer 52 can be used.

Tantalum seed layer 22 serves both as a getter layer for the boron dissolved in the layer 12 and as a promoter of perpendicular magnetization direction in the free layer. Surface magnetic anisotropy at Ta/CoFe(B) interface can serves as a source of the perpendicular anisotropy in the CoFe(B) free layer 12. Moreover, the perpendicular magnetization direction in the free layer 12 can be promoted by the surface magnetic anisotropy at the interface CoFe(B)/MgO formed by free 12 and tunnel barrier 18 layers. Similarly, the MgO/CoFe(B) interface between the tunnel barrier 18 and pinned 14 layers promotes the perpendicular anisotropy in the pinned layer made of CoFe(B).

The getter layer 52 can be made of zirconium (Zr) and may have a thickness of about 3 nm. The getter layer can absorb an excess of the boron in the pinned layer 14 and facilitate the crystallization of the layer 14 in desirable bcc (001) texture. After annealing the getter layer 52 and adjacent portion of the pinned layer 14 can be removed by etching in a vacuum chamber (FIG. 5B). 3

The getter layer 52 may cause a non-uniform distribution of the boron across the thickness of the pinned layer 14 during annealing with the boron concentration decreasing from the MgO/CoFeB interface towards CoFeB/Zr interface. The crystallization of the as-deposited amorphous CoFeB pinned layer 14 into bcc (001) texture may start from the MgO/CoFeB interface. The remote portion of the pinned layer 14 adjacent to the getter layer 52 may remain amorphous due to a substantial concentration of the boron. This portion of the pinned layer 14 alone with the getter layer 52 may be removed by post-annealing etching. The remaining after etching crystallized CoFe(B) layer 14 may have the desirable bcc (001) texture that is coherent with a crystalline texture of the MgO layer 18.

Then without breaking the vacuum after etching an $(Fe_{90}Co_{10})_{72}Tb_{28}$ layer having a thickness of about 30 nm can be formed on the etched surface of the pinned layer 14 as a pinning layer 16A. Further, a platinum (Pt) layer having a thickness of about 5 nm can be formed on the pinning layer 16A as a cap layer 24. The cap layer 24 can stabilize the perpendicular anisotropy in the pinning layer 16A and protect the pinning layer made of the RE-TM alloy from the oxidation during following processing.

Figure 6:
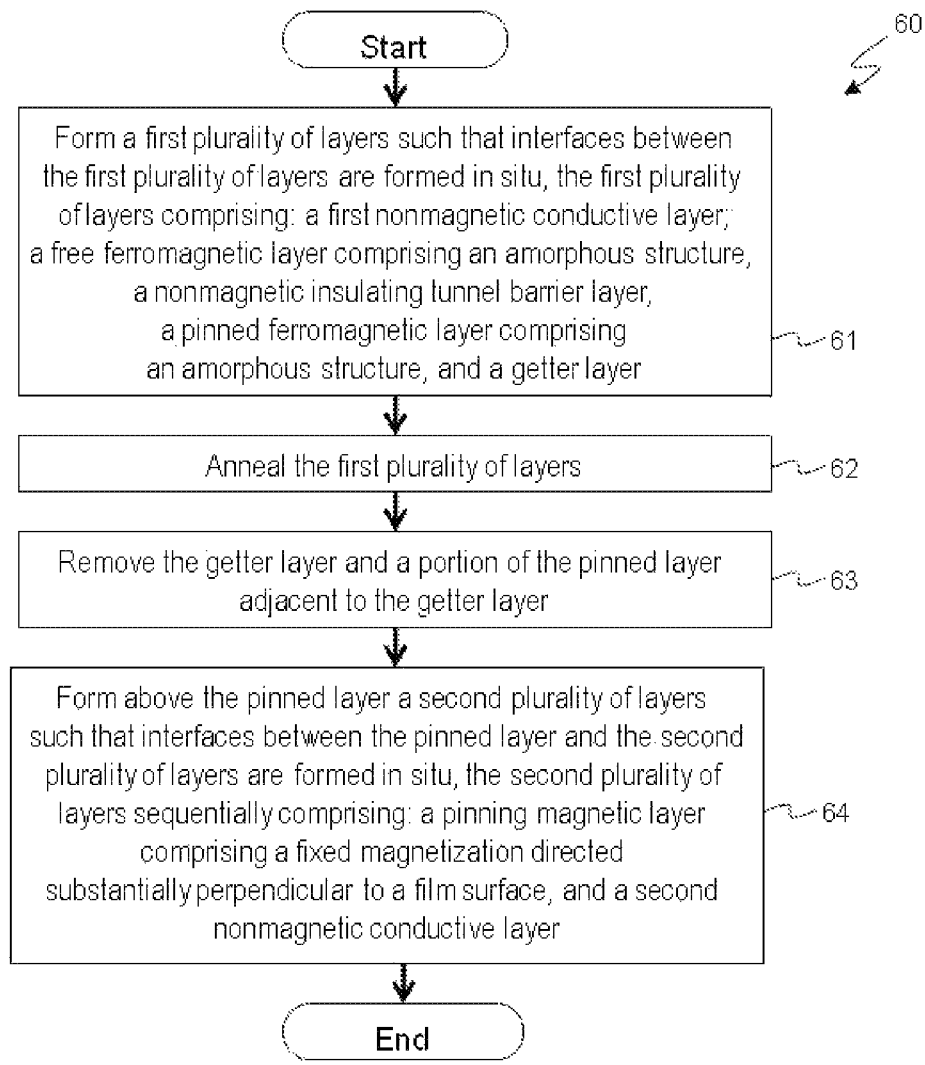
FIG. 6 illustrates a method of fabricating the magnetoresistive element shown in the FIGS. 5A-5C.

FIG. 6 illustrates an exemplary aspect of a method 60 for fabricating a spin-current switchable MR element 10 shown in FIGS. 5A-5B according to the exemplary aspects of the present disclosure. As illustrated in FIG. 6, the method 60 includes: (61) forming on a substrate a first plurality of layers such that interfaces between the first plurality of layers are formed in situ, the first plurality of layers comprising: a first nonmagnetic conductive layer, a free ferromagnetic layer comprising an amorphous structure, a nonmagnetic insulating tunnel barrier layer, a pinned ferromagnetic layer comprising an amorphous structure, and a getter layer; (62) annealing the first plurality of layers; (63) removing the getter layer and a portion of the pinned ferromagnetic layer adjacent to the getter layer; (64) forming above the pinned ferromagnetic layer a second plurality of layers such that interfaces between the pinned ferromagnetic layer and the second plurality of layers are formed in situ, the second plurality of layers sequentially comprising: a pinning magnetic layer comprising a fixed magnetization direction directed substantially perpendicular to a film surface, and a second nonmagnetic conductive layer.

It should be noted that the layers of the exemplary MR elements 10, 20, 30, and 40 disclosed above can be made of several alternative materials and may have different thickness. For example, the free magnetic layer 12 can be made of ferromagnetic material containing at least one element of the group consisting of Fe, Co and Ni, their based alloys such as CoFe, CoFeB, FeCoNi, FePt, FePd, FeB, FeNi and similar, and their based laminates such as CoFeB/Fe, CoFeB/CoFe, CoFeB/NiFe, CoFe/Fe, Co/Ni and similar. Thickness of the free layer 12 can be in a range from about 0.5 nm to about 3 nm. The free magnetic layer should have a substantial spin polarization and provide a required thermal stability factor $\Delta=K_UV/k_BT$, where $K_U$ is a crystal magnetic anisotropy, V is a volume of the free magnetic layer, $k_B$ is a Boltzmann constant, and T is a temperature. Usually the thermal stability factor $\Delta$ is about $60 \cdot k_BT$.

The pinned magnetic layer 14 can be made of the ferromagnetic materials similar to the materials used for free layer formation. Thickness of the pinned layer 14 can be in a range from about 0.5 nm to about 10 nm.

The pinning layer 16A can be made of ferrimagnetic material having a perpendicular magnetic anisotropy and containing at least one element selected from the group consisting of Fe, Co, and Ni, and at least one element selected from the group consisting from Gd, Tb, Dy, Ho, and Er such as GdFe, TbFe, DyFe, TbCo, GdCo, TbCoFe, GdFeCo and similar. To provide an antiferromagnetic exchange coupling with the pinned ferromagnetic layer 14 the pinning 16A layer can have an RE-rich composition. Thickness of the pinning ferrimagnetic layer 16A may be in a range from about 5 nm to about 75 nm.

The ferromagnetic pinning layer 16B can be made of a ferromagnetic material having a substantial crystal perpendicular anisotropy and containing at least one element selected from the group consisting of Fe, Co and Ni such as CoPt, CoCrPt, CoPtTa, FePt, FePd and similar, their based laminates such as Co/Pt, CoFe/Pt, CoFe/Pd, Fe/Pt, Fe/Pd, Ni/Co and similar. Thickness of the pinning ferromagnetic layer 16B may be in a range from about 2.5 nm to about 25 nm.

The tunnel barrier layer 18 can be made of an oxide or semiconductor such $MgO_x$, $AlO_x$, $TaO_x$, $TiO_x$, $NbO_x$, Si, Ge, C, SiC, SiGe and similar, and their based laminates. Thickness of the tunnel barrier layer 18 may be in a range from about 0.5 nm to about 3 nm.

The seed layer 22 can be made of material containing at least one element selected from the group consisting of Ta, W, V, Cr, Nb, Mo, Cu, and Ag, their based alloys and laminates. The thickness of the seed layer 22 can be in a range from about 0.5 nm to about 50 nm.

The cap layer 24 can be made material containing at least one element selected from the group consisting of Pt, Pd, Au, Ta, Ru, Ti, Mo, and W, their based alloys and laminates. Thickness of the cap layer 24 can be in a range from about 0.5 nm to about 25 nm.

The interface layer 26 can be made of a ferromagnetic material containing at least one element selected from the group consisting of Fe, Co, and Ni, and at least one element selected from the group consisting of B, P, and Zr, such as FeB, CoFeB, FeNiB, CoFeSiB, FeNiP and similar. The thickness of the interface layers 26 can be in range from about 0.25 nm to about 2.5 nm.

The spacer layer 32 can be made of material containing at least one element selected from the group consisting of Ru, Ir, Rh, Re, Cu, Cr, V and W, their base alloys such as RuRh and/or laminates such as Ru/Rh. Thickness of the spacer layer 32 can be in a range from about 0.3 nm to about 2.5 nm.

The getter layer 52 can be made of material containing at least one element selected from the group consisting of Zr, Ti, Hf, Ta, and Nb, based alloys and laminates. Thickness of the getter layer 52 may be in a range from about 1 nm to about 10 nm.

Note that this specification mainly refers to an MR element using magnetic materials having perpendicular anisotropy. However, the present invention is also applicable to an MR element using a magnetic layer having in-plane magnetization direction.

While the specification of this disclosure contains many specifics, these should not be construed as limitations on the scope of the disclosure or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above embodiments are intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

While the disclosure has been described in terms of several exemplary embodiments, those skilled in the art will recognize that the disclosure can be practiced with modification within the spirit and scope of the appended claims. Specifically, one of ordinary skill in the art will understand that the drawings herein are meant to be illustrative, and the spirit and scope of the disclosure are not limited to the embodiments and aspects disclosed herein but may be modified.

What is claimed is:

1. A method of fabricating a magnetoresistive element, the method comprising:
    forming on a substrate a first plurality of layers such that interfaces of the first plurality of layers are formed without breaking a vacuum, the first plurality of layers comprising:
        a first nonmagnetic conductive layer formed above the substrate;
        a first ferromagnetic layer formed above the first nonmagnetic conductive layer and comprising an amorphous structure and a first magnetization direction;
        a nonmagnetic tunnel barrier layer formed above the first ferromagnetic layer;
        a second ferromagnetic layer formed above the nonmagnetic tunnel barrier layer and comprising an amorphous structure and a second magnetization direction, and
        a getter layer formed above an having a direct contact with the second ferromagnetic layer;
    annealing the first plurality of layers;
    removing the getter layer and a portion of the second ferromagnetic layer adjacent to the getter layer;
    forming above the second ferromagnetic layer a second plurality of layers such that interface between the second ferromagnetic layer and the second plurality of layers is formed without breaking a vacuum after removing the getter layer and the portion of the second ferromagnetic layer, the second plurality of layers comprising:
        a third magnetic layer formed above the second ferromagnetic layer and comprising a third fixed magnetization direction directed substantially perpendicular to a substrate surface, and
        a second nonmagnetic conductive layer formed above the third magnetic layer;
    wherein the first ferromagnetic layer, the tunnel barrier layer, and the second ferromagnetic layer crystallize during annealing into a coherent body-centered cubic (bcc) structure with (001) plane oriented, the first magnetization direction and the second magnetization direction are directed substantially perpendicular to the substrate surface, the second magnetization direction is fixed and is directed antiparallel to the third magnetization direction, and the first magnetization direction is reversible and is controlled by a direction of a spin-polarized current running through the magnetoresistive element in a direction perpendicular to the substrate surface.

2. The method of claim 1, wherein the first nonmagnetic conductive layer contains at least one element selected from the group consisting of V, Cr, Nb, Mo, Ta, and W.

3. The method of claim 1, wherein the getter layer contains at least one element selected from the group consisting of Zr, Ti, Hf, Ta, and Nb.

4. The method of claim 1, wherein the second nonmagnetic conductive layer contains at least one element selected from the group consisting of Pt, Pd, Au, Ta, Ru, Ti, Mo, and W.

5. The method of claim 1, wherein the third magnetic layer comprises a ferrimagnetic material containing at least one element selected from the group consisting of Fe, Co, and Ni, and at least one element selected from the group consisting of Gd, Tb, Dy, Ho, and Er.

6. The method of claim 1, wherein the second plurality of layers further comprising
   a nonmagnetic spacer layer disposed between the second ferromagnetic layer and the third magnetic layer,
   wherein the third magnetic layer comprises a ferromagnetic material containing at least one element selected from the group consisting of Fe, Co, and Ni, and the nonmagnetic spacer layer contains at least one element selected from the group consisting of Ru, Ir, Rh, Re, Cu, Cr, V, W, and Ta.

7. The method of claim 6, wherein the second plurality of layers further comprising
   an interface ferromagnetic layer disposed between the second ferromagnetic layer and the nonmagnetic spacer layer,
   wherein the interface ferromagnetic layer contains at least one element selected from the group consisting of Fe, Co, and Ni, and at least one element selected from the group consisting of B, P, and Zr.

8. The method of claim 1, wherein annealing the first plurality of layers further comprises annealing at a temperature between about 250° C. and about 375° C. for a duration between about 0.5 hour and about 10 hours.

9. The method of claim 1, wherein annealing the first plurality of layers further comprises annealing at a temperature between about 250° C. and about 375° C. for a duration between about 0.5 hour and about 10 hours in a presence of a magnetic field of at least about 100 Oe.

* * * * *